(12) United States Patent
Ishii et al.

(10) Patent No.: US 9,130,548 B2
(45) Date of Patent: Sep. 8, 2015

(54) PULSE STRETCHING CIRCUIT AND METHOD

(71) Applicant: INTERNATIONAL BUSINESS MACHINES CORPORATION, Armonk, NY (US)

(72) Inventors: Masatoshi Ishii, Shiga-ken (JP); Gen Yamada, Shiga (JP); Hisatada Miyatake, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 13/688,793

(22) Filed: Nov. 29, 2012

(65) Prior Publication Data

US 2013/0141148 A1 Jun. 6, 2013

(30) Foreign Application Priority Data

Dec. 1, 2011 (JP) .................. 2011-264098

(51) Int. Cl.
*H03K 5/04* (2006.01)
*H03K 3/017* (2006.01)

(52) U.S. Cl.
CPC . *H03K 3/017* (2013.01); *H03K 5/04* (2013.01)

(58) Field of Classification Search
USPC ........................................ 327/174
See application file for complete search history.

(56) References Cited

U.S. PATENT DOCUMENTS 5,309,034 A * 5/1994 Ishibashi .............. 327/174
5,451,893 A * 9/1995 Anderson .............. 327/174
5,566,129 A * 10/1996 Nakashima et al. ....... 365/233.5
6,476,657 B2 * 11/2002 Kuhne .................. 327/291
2003/0236802 A1 * 12/2003 Epstein ................. 708/250
2007/0126490 A1 * 6/2007 Prodanov et al. ......... 327/291

FOREIGN PATENT DOCUMENTS

| JP | 6-152269 A | 5/1994 |
| JP | 7-95018 A | 4/1995 |
| JP | 7093975 A | 4/1995 |
| JP | 9083313 A | 3/1997 |
| JP | 11-136103 A | 5/1999 |
| JP | 2000-278100 A | 10/2000 |
| JP | 2001223569 A | 8/2001 |
| JP | 2007-228044 A | 9/2007 |
| JP | 2011-166232 A | 8/2011 |

OTHER PUBLICATIONS

Application 2011-26408, filed Dec. 1, 2011, entitled: "Pulse Stretching Circuit and Method".

* cited by examiner

*Primary Examiner* — Lincoln Donovan
*Assistant Examiner* — Patrick Chen
(74) *Attorney, Agent, or Firm* — Keivan Razavi; Yuanmin Cai.

(57) ABSTRACT

A pulse stretching circuit having a pulse delay circuit for receiving an input pulse signal and for outputting a delay pulse signal, and a pulse adjustment circuit, connected to the pulse delay circuit, receiving the input pulse signal and the delay pulse signal and for outputting an output pulse signal having a pulse width longer than a pulse width of the input pulse signal. The pulse adjustment circuit causes a leading edge of the output pulse signal in response to a leading edge of the input pulse signal, keeps a state in which the output pulse signal is displaced with the leading edge thus caused longer than a total time of times for both pulse widths of the input pulse signal and the delay pulse signal, and causes a trailing edge of the output pulse signal in response to a trailing edge of the delay pulse signal.

5 Claims, 6 Drawing Sheets

PULSE STRETCHING CIRCUIT AND METHOD

CLAIM OF PRIORITY

The present application claims the benefit of priority of JP patent application 2011-264098, entitled "PULSE STRETCHING CIRCUIT AND METHOD", filed Dec. 1, 2011, with the Japanese Patent and Trademark Office, the content of which is incorporated herein by reference in its entirety.

FIELD OF THE INVENTION

The present invention relates to a pulse stretching circuit and method for stretching a pulse width of a pulse signal, and particularly to a pulse stretching circuit and method for stretching a pulse width of a pulse signal without causing glitches.

BACKGROUND ART

One example of a conventional pulse stretching circuit is illustrated in FIG. 1. A pulse stretching circuit 100 is constituted by a pulse delay circuit 110 and an OR gate 120. The pulse delay circuit 110 includes two or more even number of serially-connected inverters, that is, NOT (negative) circuits. The OR gate 120 includes a 2-input NOR (non-disjunction) circuit and an inverter connected in series thereto. The pulse delay circuit 110 generates a delay pulse signal b from an input pulse signal a, and the OR gate 120 generates a logical sum of the input pulse signal a and the delay pulse signal b to generate an output pulse signal c having a stretched pulse width.

FIG. 2 illustrates a waveform diagram of each of the pulse signals a, b and c. In (A), the delay pulse signal b (a displaced portion) is generated at a timing that does not exceed a pulse width of the input pulse signal a (a width of its displaced portion), thereby generating the output pulse signal c (a displaced portion) having a pulse width stretched due to overlap of the displaced portion of the delay pulse signal b with the displaced portion of the input pulse signal a (a normal operation waveform). On the other hand, in (B), the delay pulse signal b is generated at a timing which exceeds the pulse width of the input pulse signal a, namely, in an extremely delayed fashion, thereby generating the output pulse signal c having a glitch (two displaced portions) because the displaced portion of the input pulse signal a and the displaced portion of the delay pulse signal b do not overlap with each other (abnormal operation waveform). When a pulse waveform with a glitch is used, malfunctions of a circuit are caused, and therefore, a pulse stretching circuit which does not cause glitches is required.

As a method for realizing a pulse stretching circuit which does not cause glitches, there have been known a circuit 300 having such a structure that normal pulse stretching circuits 100 are connected in series at multiple stages as illustrated in FIG. 3 and a circuit 400 having such a structure that pulse stretching circuits 100' are hierarchically used at portions for pulse delay circuits 110 as illustrated in FIG. 4. In either case, a pulse delay circuit should be divided into a plurality of circuits and each of the divided circuits requires an OR gate, thereby making a circuit scale large. A large circuit scale increases a manufacture cost of a circuit and increases power consumption, which becomes a problem.

Japanese Unexamined Patent Publication No. 9-83313 discloses a pulse-width adjustment circuit in which chopper circuits, each including an inverter string for delaying an input pulse and an OR gate circuit for receiving the input pulse and a delay pulse from the inverter string, are connected in cascade at two stages.

Japanese Unexamined Patent Publication No. 11-136103 discloses a pulse stretching circuit in which circuits, each including a delay element for delaying an input signal and an AND element for receiving the input signal and a delay signal from the delay element, are connected in series at multiple stages.

Japanese Unexamined Patent Publication No. 2001-223569 discloses a pulse stretching circuit in which a plurality of serially-connected buffers are connected in series with each other at three stages via AND gates each provided between respective stages, and an OR operation is performed on an input signal of the endmost input port of the three stages, an output signal of each stage, and an output signal of the endmost output port of the three stages so as to stretch a pulse width.

Japanese Unexamined Patent Publication No. 7-93975 discloses that a plurality of delay circuits are connected in series with each other, and an OR operation is performed on an input pulse signal and output pulse signals of the respective delay circuits so as to synthesize and stretch a pulse signal.

SUMMARY OF THE INVENTION

It is an object of the present invention to realize a pulse stretching circuit and method which can stretch a pulse width of a pulse signal with a small circuit scale without causing glitches. The object of the present invention includes providing such a pulse stretching circuit and method.

A pulse stretching circuit of one embodiment provided according to the present invention includes: a pulse delay circuit for receiving an input pulse signal and for outputting a delay pulse signal; and a pulse adjustment circuit connected to the pulse delay circuit, the pulse adjustment circuit being for receiving the input pulse signal and the delay pulse signal and for outputting an output pulse signal having a pulse width longer than a pulse width of the input pulse signal. The pulse adjustment circuit causes a leading edge of the output pulse signal in response to a leading edge of the input pulse signal, keeps a state in which the output pulse signal is displaced with the leading edge thus caused longer than a total time of times for both pulse widths of the input pulse signal and the delay pulse signal, and causes a trailing edge of the output pulse signal in response to a trailing edge of the delay pulse signal.

In one embodiment that the pulse adjustment circuit may include: a latch circuit set by a set signal generated from the input pulse signal, reset by a reset signal generated from the delay pulse signal, and causing an output which does not take an indefinite value; and an OR circuit connected to the pulse delay circuit and the latch circuit, the OR circuit being for outputting a logical sum of the input pulse signal, the delay pulse signal, and the output pulse signal of the latch circuit.

The OR circuit may include: a 3-input NOR circuit for receiving the input pulse signal, the delay pulse signal, and the output pulse signal of the latch circuit; and an inverter connected to the 3-input NOR circuit.

The latch circuit may include: a reset delay circuit for receiving the delay pulse signal and for outputting the reset signal; and a 2-input NOR circuit connected to the reset delay circuit, the 2-input NOR circuit being for receiving an output pulse signal of the 3-input NOR circuit and the reset signal.

The input pulse signal may be reversed to be provided, and the OR circuit include a 3-input NAND (non-conjunction)

circuit for receiving the input pulse signal, the delay pulse signal, and the output pulse signal of the latch circuit.

The latch circuit may include: a reset delay circuit for receiving the delay pulse signal and for outputting the reset signal; and a 2-input NAND circuit connected to the reset delay circuit, the 2-input NAND circuit being for receiving an output pulse signal of the 3-input NAND circuit and the reset signal.

The reset delay circuit may include a plurality of inverters.

The latch circuit may include a first 2-input NOR circuit and a second 2-input NOR circuit, the first 2-input NOR circuit receive the input pulse signal and an output pulse signal of the second 2-input NOR circuit, and the second 2-input NOR circuit receive the delay pulse signal and an output pulse signal of the first 2-input NOR circuit and outputs an output pulse signal of the latch circuit.

The latch circuit may include: a first inverter for receiving the input pulse signal; a second inverter for receiving the delay pulse signal; a 2-input NOR circuit connected to the second inverter, the 2-input NOR circuit being for receiving the input pulse signal and an output pulse signal of the second inverter; a first PFET (P-type FET) including a gate connected to an output of the first inverter; a first NFET (N-type FET) connected in series with the first PFET and including a gate connected to an output of the 2-input NOR circuit; a second PFET connected in parallel with the first PFET; a second NFET connected in parallel with the first NFET and connected in series with the second PFET; a third inverter including an input connected to an output of the first PFET and NFET connected in series with each other and to an output of the second PFET and NFET connected in series with each other, and including an output connected to both gates of the second PFET and NFET, and the output of the first PFET and NFET connected in series with each other and the output of the second PFET and NFET connected in series with each other serve as an output of the latch circuit. The second PFET and NFET have a driving force weaker than that of the first PFET and NFET.

The pulse adjustment circuit may include: a first inverter for receiving the input pulse signal; a second inverter for receiving the delay pulse signal; a 2-input NOR circuit connected to the second inverter, the 2-input NOR circuit being for receiving the delay pulse signal and an output pulse signal of the second inverter; a first PFET including a gate connected to an output of the first inverter; a first NFET connected in series with the first PFET and including a gate connected to an output of the 2-input NOR circuit; a second PFET connected in parallel with the first PFET; a second NFET connected in parallel with the first NFET and connected in series with the second PFET; a third inverter including an input connected to an output of the first PFET and NFET connected in series with each other and to an output of the second PFET and NFET connected in series with each other, and including an output connected to both gates of the second PFET and NFET, and the output of the first PFET and NFET connected in series with each other and the output of the second PFET and NFET connected in series with each other serve as an output of the pulse adjustment circuit. The second PFET and NFET have a driving force weaker than that of the first PFET and NFET.

A pulse stretching method of one embodiment provided according to the present invention includes: generating a delay pulse signal from an input pulse signal; and generating an output pulse signal having a pulse width longer than a pulse width of the input pulse signal, from the input pulse signal and the delay pulse signal thus generated, wherein in the generating of an output pulse signal, a leading edge of the output pulse signal is caused in response to a leading edge of the input pulse signal, a state in which the output pulse signal is displaced with the leading edge thus caused is kept longer than a total time of times for both pulse widths of the input pulse signal and the delay pulse signal, and a trailing edge of the output pulse signal is caused in response to a trailing edge of the delay pulse signal.

The method may include: generating a set signal from the input pulse signal; latching, by the set signal, the state in which the output pulse signal is displaced with the leading edge thus caused; generating a reset signal from the delay pulse signal; and resetting the latching of the state by the reset signal.

According to the present invention, it is possible to realize a pulse stretching circuit and method which can stretch a pulse width of a pulse signal with a small circuit scale, without causing glitches. Particularly, it is possible to prevent malfunctions of a circuit due to a glitch of an output pulse signal. Further, a manufacture cost of a circuit may be reduced and power consumption may be reduced because the circuit scale is small as compared with conventional circuits. Further, since timing adjustment of a pulse delay circuit, which has been conventionally necessary to avoid glitches, is unnecessary, circuit design becomes easier. That is, it is possible to design a pulse stretching circuit without paying attention to whether an input pulse signal and a delay pulse signal overlap with each other or not.

DETAILED DESCRIPTION

Figure 1:
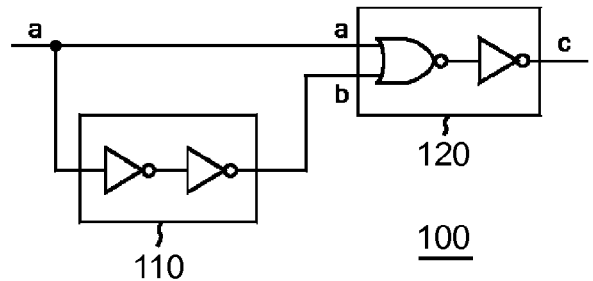
FIG. 1 is a circuit diagram of a conventional pulse stretching circuit.
Figure 2A:
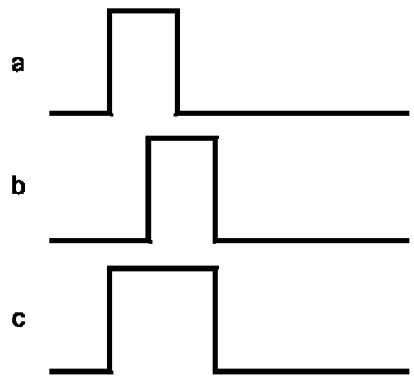
FIG. 2 is a waveform diagram of a circuit illustrated in FIG. 1; (A) of FIG. 2 illustrates a normal operation waveform which does not cause glitches, and (B) of FIG. 2 illustrates an abnormal operation waveform which causes a glitch.
Figure 2B:
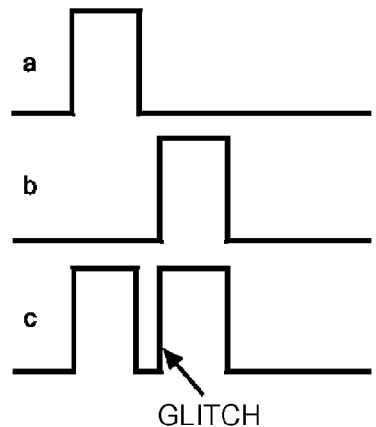

Preferred embodiments to carry out the present invention will hereinafter be described in detail with reference to drawings, but the following embodiments do not limit the invention according to Claims, and further, all combinations of the features described in the embodiments may not be essential to the solution of the invention. The present invention can be carried out in various different aspects and should not be interpreted within the contents of the described embodiments. Note that the same reference numeral is referred to the same component or constituent through the entire explanation of the embodiments.

Figure 5:
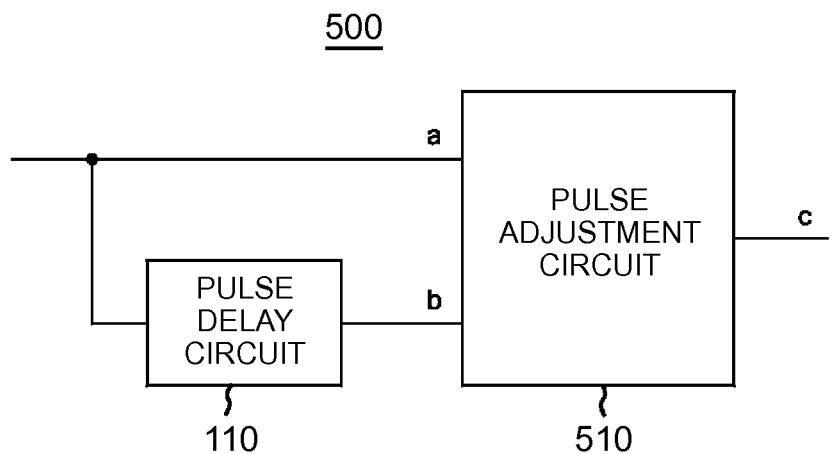
FIG. 5 is a schematic view of a pulse stretching circuit according to one embodiment of the present invention.

FIG. 5 is a schematic view of a pulse stretching circuit 500 according to one embodiment of the present invention. The pulse stretching circuit 500 includes a pulse delay circuit 110 and a pulse adjustment circuit 510. The pulse delay circuit 110 receives an input pulse signal a and outputs a delay pulse signal b. The pulse adjustment circuit 510 is connected to the pulse delay circuit 110, receives the input pulse signal a and the delay pulse signal b, and outputs an output pulse signal c having a pulse width longer than a pulse width of the input pulse signal a.

Figure 6:
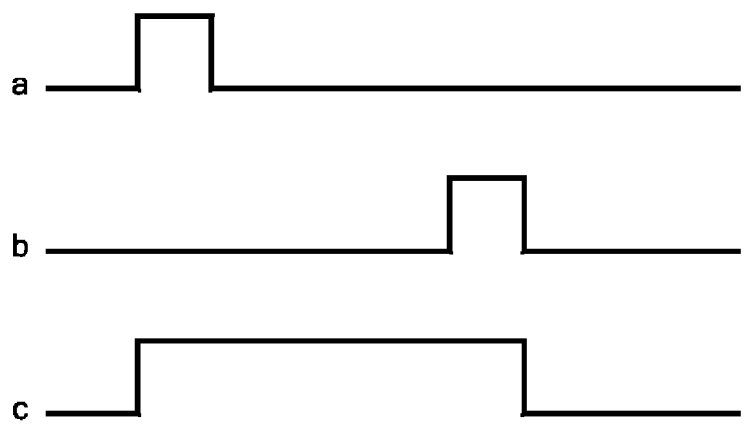
FIG. 6 is a waveform diagram of a circuit illustrated in FIG. 5.

FIG. 6 illustrates a waveform diagram of each of the pulse signals a, b and c of the pulse stretching circuit 500. As illustrated in this waveform diagram, the delay pulse signal b is generated from the input pulse signal a, and the output pulse signal c having a pulse width longer than the pulse width of the input pulse signal a is generated from the input pulse signal a and the delay pulse signal b. A leading edge of the output pulse signal c is caused in response to a leading edge of the input pulse signal a. A state (a projected state in FIG. 6) in which the output pulse signal c is displaced with the leading edge thus caused is kept longer than a total time of times for both pulse widths of the input pulse signal a and the delay pulse signal b. Also, a trailing edge of the output pulse signal c is caused in response to a trailing edge of the delay pulse signal b. Note that a pulse waveform producing a projected state as an example is used as a pulse stretching circuit, but a pulse waveform producing a depressed state may be also usable.

Figure 7:
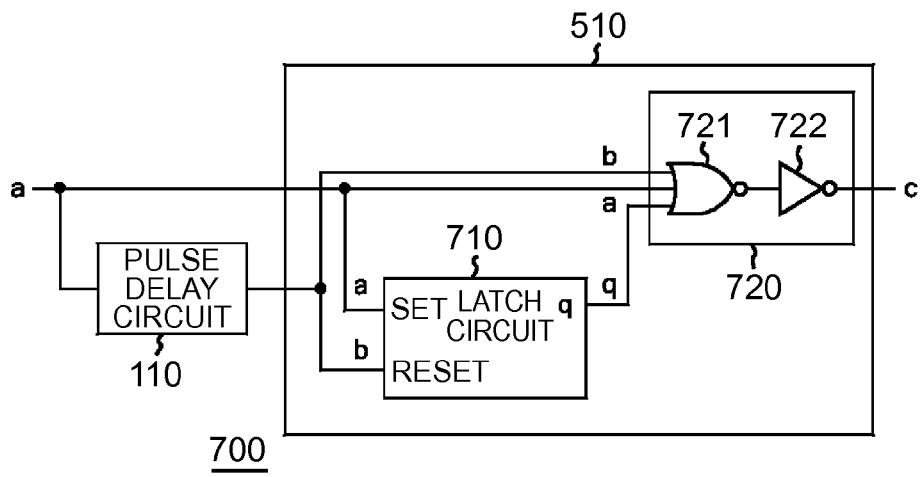
FIG. 7 is a circuit diagram illustrating one example of a pulse stretching circuit.

FIG. 7 illustrates one exemplary pulse stretching circuit 700. In the pulse stretching circuit 700, a pulse adjustment circuit 510 includes a latch circuit 710 and an OR circuit 720. The latch circuit 710 is a latch circuit which is connected to a pulse delay circuit 110, which is set by a set signal generated from an input pulse signal a, which is reset by a reset signal generated from a delay pulse signal b, and in which an output does not take an indefinite value. With the use of such a latch circuit 710, no glitch is caused in an output pulse signal q regardless of a delay time of the pulse delay circuit 110. The OR circuit 720 is connected to the pulse delay circuit 110 and the latch circuit 710, and generates a logical sum of an input pulse signal a, a delay pulse signal b, and an output pulse signal q of the latch circuit 710 and outputs an output pulse signal c. The OR circuit 720 includes a 3-input NOR circuit 721 for receiving the input pulse signal a, the delay pulse signal b, and an output pulse signal q of the latch circuit 710, and an inverter 722 connected to the 3-input NOR circuit 721.

Figure 8:
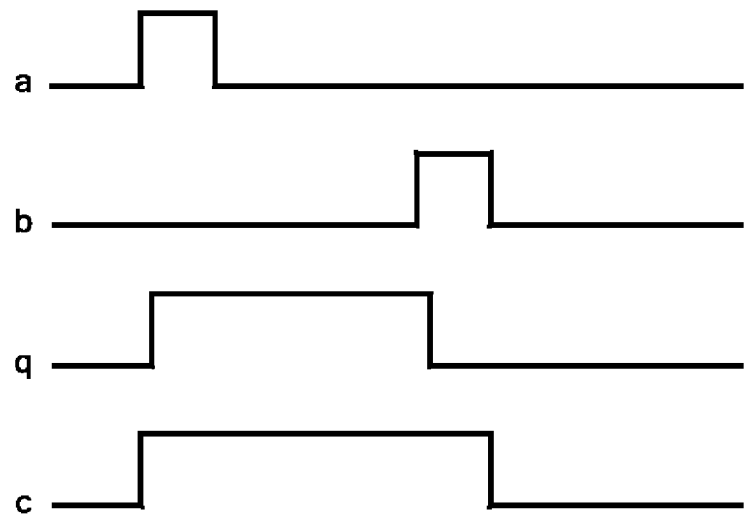
FIG. 8 is a waveform diagram of the circuit illustrated in FIG. 7.

FIG. 8 illustrates a waveform diagram of each of the pulse signals a, b, q and c of the pulse stretching circuit 700. As illustrated in this waveform diagram, a leading edge of the output pulse signal c is caused in response to a leading edge of the input pulse signal a. A state (a projected state in FIG. 8) in which the output pulse signal c is displaced with the leading edge thus caused is kept longer than a total time of times for both pulse widths of the input pulse signal a and the delay pulse signal b. The output pulse signal q of the latch circuit 710 is used to keep this state. Particularly, this state is latched by a set signal generated from the input pulse signal a, and the latching of this state is reset by a reset signal generated from the delay pulse signal b. Also, a trailing edge of the output pulse signal c is caused in response to a trailing edge of the delay pulse signal b.

Figure 3:
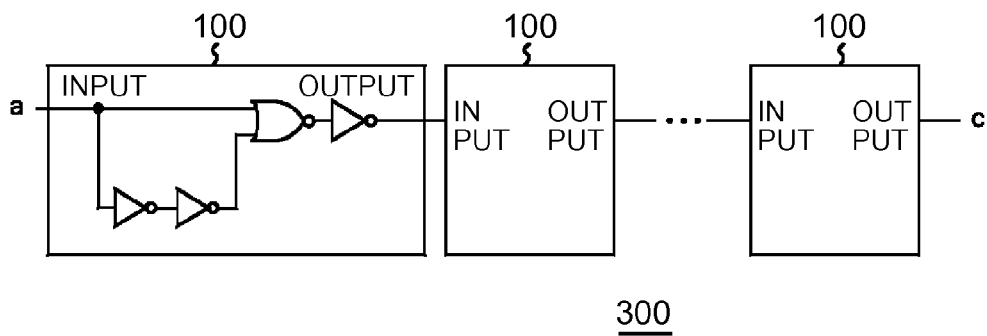
FIG. 3 is a circuit diagram of a structure in which conventional pulse stretching circuits are connected in series with each other at multiple stages.
Figure 4:
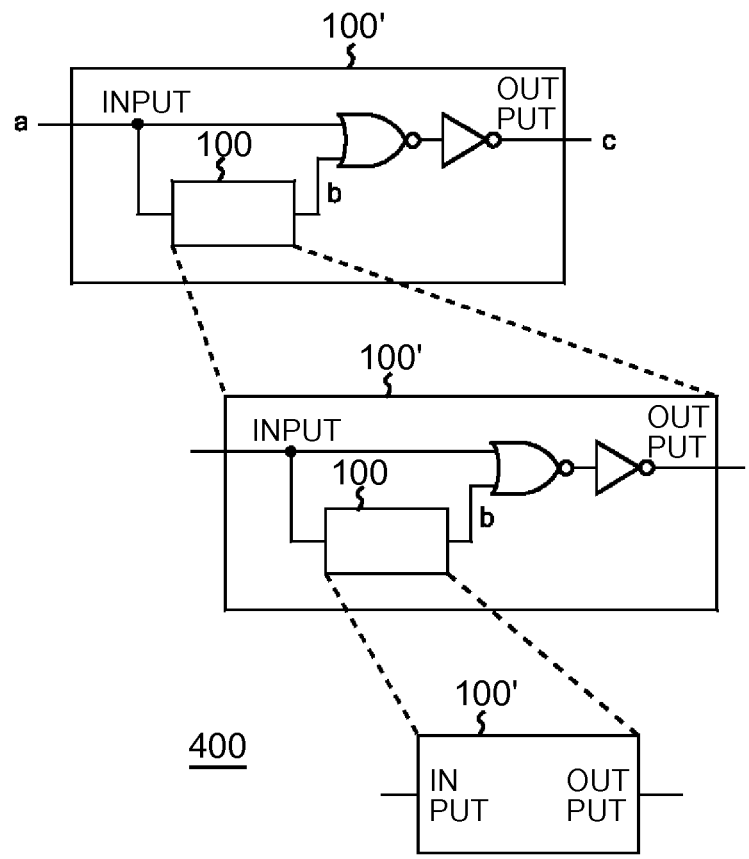
FIG. 4 is a circuit diagram of a structure in which conventional pulse stretching circuits are used hierarchically.
Figure 9:
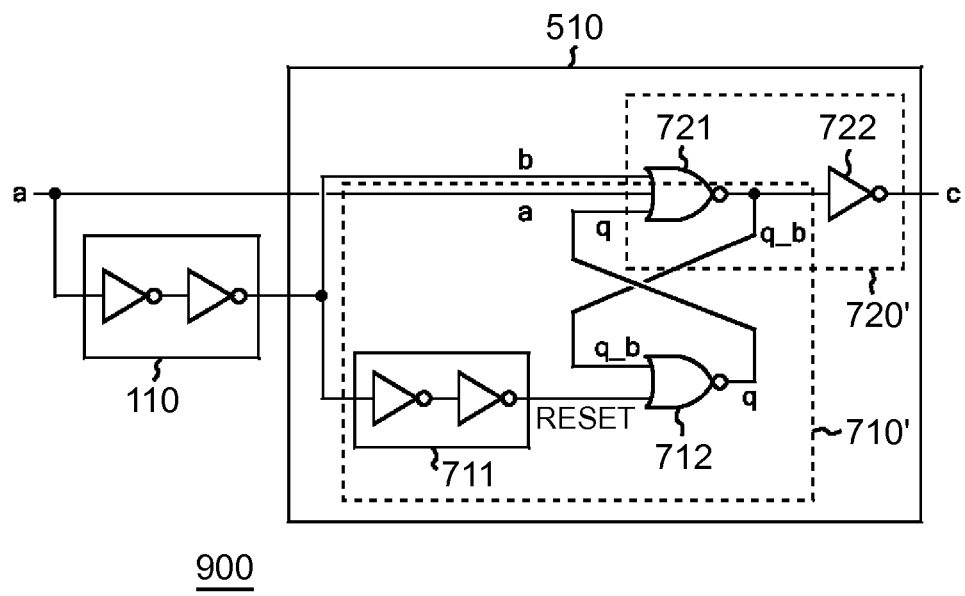
FIG. 9 is a circuit diagram illustrating one example of a pulse stretching circuit.

FIG. 9 illustrates one exemplary pulse stretching circuit 900. In the pulse stretching circuit 900, a latch circuit 700' of a pulse adjustment circuit 510 includes a reset delay circuit 711, a 2-input NOR circuit 712, and a 3-input NOR circuit 721. The reset delay circuit 711 receives a delay pulse signal b and outputs a reset signal. The 2-input NOR circuit 712 is connected to the reset delay circuit 711, receives an output pulse signal q_b of the 3-input NOR circuit 721 and the reset signal, and outputs an output pulse signal q serving as an output of the latch circuit 710'. The reset delay circuit 711 includes two or more even number of inverters connected in series with each other. The 3-input NOR circuit 721 is included in the OR circuit 720' and the latch circuit 710'. An input pulse signal a to be input into the 3-input NOR circuit 721 of the OR circuit 720' becomes a set signal of the latch circuit 710'. In the OR circuit 720', an output pulse signal c is output from the inverter 722 connected in series with the 3-input NOR circuit 721. The reset delay circuit 711 prevents a reset signal reset of the latch circuit 710' from being turned off at the same time as the delay pulse signal b, and also prevents output pulse signals q and q_b of the latch circuit 710' from becoming an indefinite value. The number of gate elements to be added is several in comparison with the conventional pulse stretching circuit 100 of FIG. 1, and the circuit scale can be reduced more than the conventional circuit 300 of FIG. 3 and the conventional circuit 400 of FIG. 4.

Figure 10:
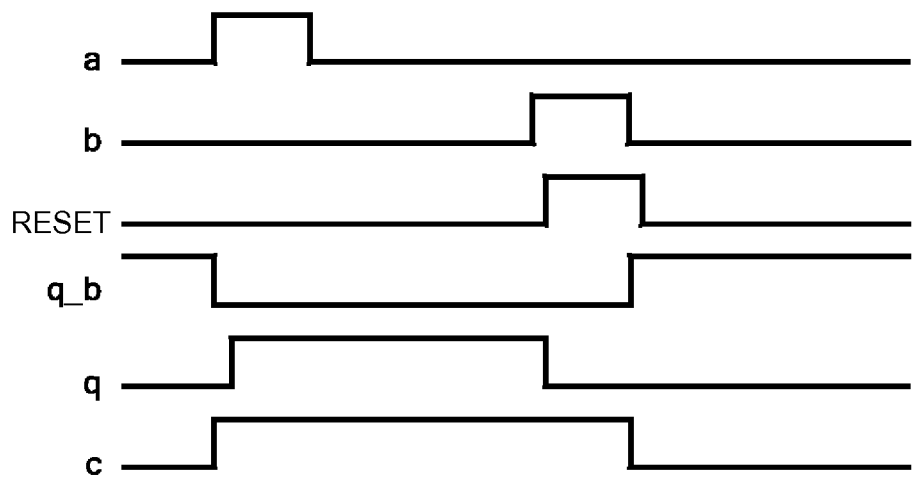
FIG. 10 is a waveform diagram of the circuit illustrated in FIG. 9.

FIG. 10 illustrates a waveform diagram of each of the pulse signals a, b, reset, q_b, q, and c of the pulse stretching circuit 900. As illustrated in this waveform diagram, a leading edge of the output pulse signal c is caused in response to a leading edge of the input pulse signal a. A state (a projected state in FIG. 10) in which the output pulse signal c is displaced with the leading edge thus caused is kept longer than a total time of times for both pulse widths of the input pulse signal a and the delay pulse signal b. The latch circuit 710' is used to latch this state. Particularly, this state is latched by a set signal generated from the input pulse signal a, and the latching of this state is reset by a reset signal (reset in FIG. 10) generated from the delay pulse signal b. A reset signal reset is generated by delaying the delay pulse signal b by the reset delay circuit 711, but its delay time is set so as not to exceed a pulse width of the delay pulse signal b. Also, a trailing edge of the output pulse signal c is caused in response to a trailing edge of the delay pulse signal b.

Figure 11:
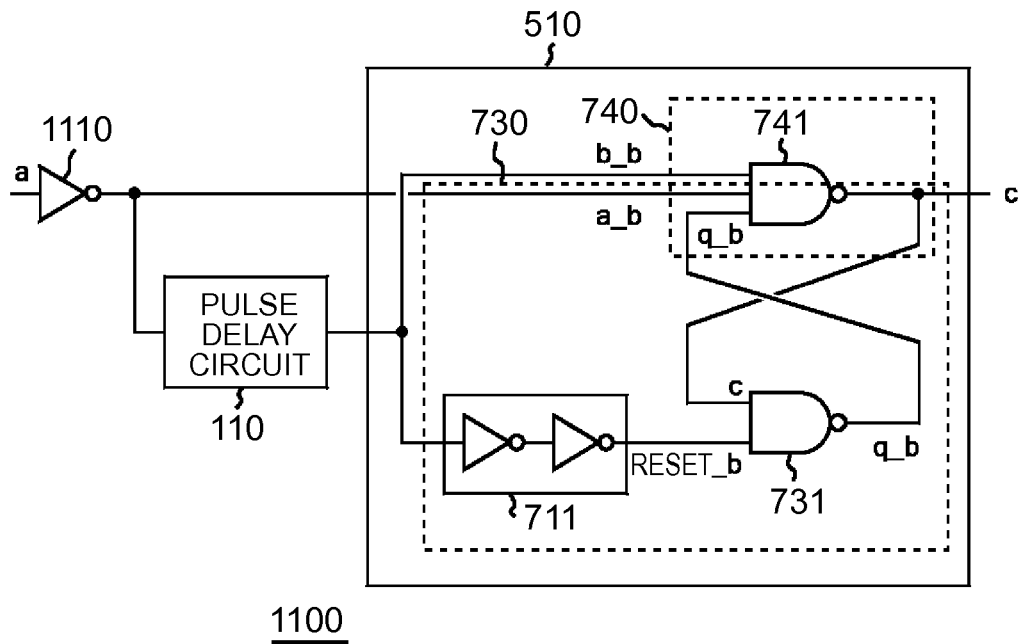
FIG. 11 is a circuit diagram illustrating one example of a pulse stretching circuit.

FIG. 11 illustrates one exemplary pulse stretching circuit 1100. In the pulse stretching circuit 1100, an input pulse signal a is provided in such a manner that the input pulse signal a is reversed by the inverter 1110, and a reversed input pulse signal a_b is input into a pulse delay circuit 110. The pulse adjustment circuit 510 includes a latch circuit 730 and an OR circuit 740. The OR circuit 740 includes a 3-input NAND circuit 741 for receiving the reversed input pulse signal a_b, its delay pulse signal b_b, and an output pulse signal q_b of the latch circuit 730. The latch circuit 730 includes a reset delay circuit 711, a 2-input NAND circuit 731, and a 3-input NAND circuit 741. The reset delay circuit 711 receives the delay pulse signal b_b and outputs a reset signal reset _b. The 2-input NAND circuit 731 is connected to the reset delay circuit 711, receives an output pulse signal c of the 3-input NAND circuit 741 and the reset signal_b, and outputs the output pulse signal q_b serving as an output of the latch circuit 730. The 3-input NAND circuit 741 of the OR circuit 740 serves as a part of the latch circuit 730.

Figure 12:
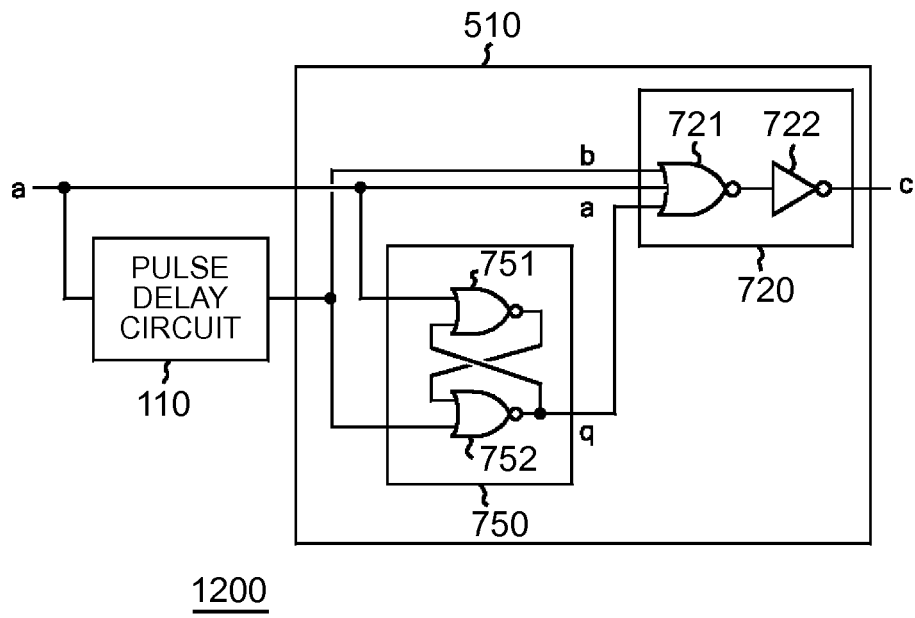
FIG. 12 is a circuit diagram illustrating one example of a pulse stretching circuit.

FIG. 12 illustrates one exemplary pulse stretching circuit 1200. In the pulse stretching circuit 1200, a latch circuit 750 of a pulse adjustment circuit 510 includes a first 2-input NOR circuit 751 and a second 2-input NOR circuit 752. The first 2-input NOR circuit 751 receives an input pulse signal a and an output pulse signal of the second 2-input NOR circuit 752. An output pulse signal of the first 2-input NOR circuit 751 becomes an input of the second 2-input NOR circuit 752. The second 2-input NOR circuit 752 receives a delay pulse signal b and the output pulse signal of the first 2-input NOR circuit 751, and outputs an output pulse signal q serving as an output of the latch circuit 750. The input pulse signal a, the delay pulse signal b, and the output pulse signal q of the latch circuit 750 are input into a 3-input NOR circuit 721 of an OR circuit 720. In the OR circuit 720, an output pulse signal c is output from an inverter 722 connected in series with the 3-input NOR circuit 721.

Figure 13:
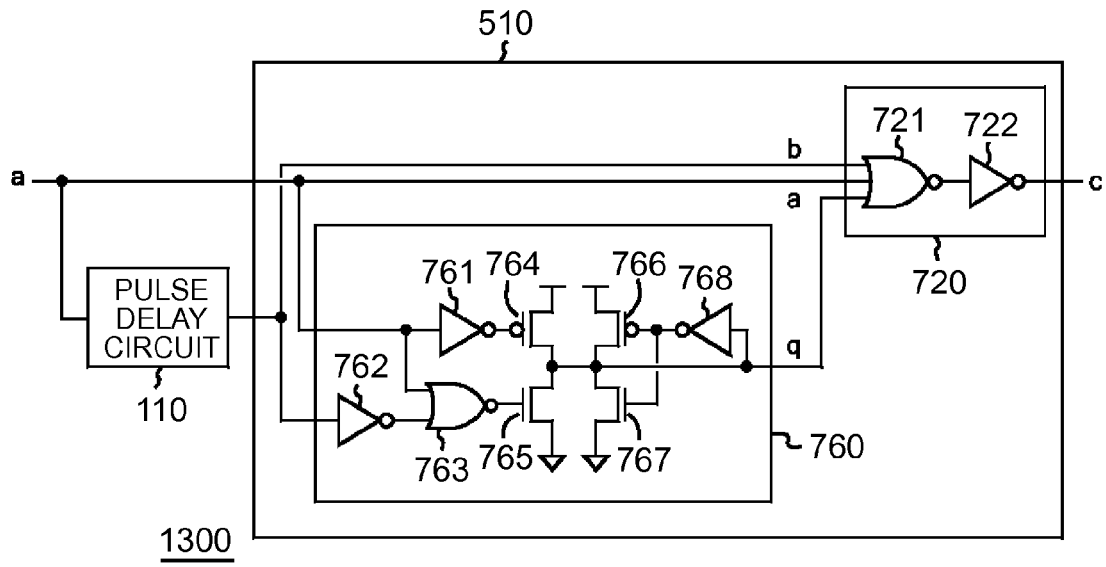
FIG. 13 is a circuit diagram illustrating one example of a pulse stretching circuit.

FIG. 13 illustrates one exemplary pulse stretching circuit 1300. In the pulse stretching circuit 1300, a latch circuit 760 of a pulse adjustment circuit 510 has the following configuration. That is, an input pulse signal a is input into a first inverter 761, and a delay pulse signal b is input into a second inverter 762. A 2-input NOR circuit 763 is connected to the second inverter 762, and the input pulse signal a and an output pulse signal of the second inverter 762 are input therein. A first PFET 764 includes a gate connected to an output of the first inverter 761. A first NFET 765 is connected in series with the first PFET 764 and includes a gate connected to an output of the 2-input NOR circuit 763. A second PFET 766 is connected in parallel with the first PFET 764. A second NFET 767 is connected in parallel with the first NFET 765, and connected in series with the second PFET 766. A third inverter 768 includes an input connected to an output of the first PFET 764 and NFET 765 connected in series with each other and to an output of the second PFET 766 and NFET 767 connected in series with each other, and includes an output connected to both gates of the second PFET 766 and NFET 767. The output of the first PFET 764 and NFET 765 connected in series with each other and the output of the second PFET 766 and NFET 767 connected in series with each other serve as an output of the latch circuit 760. The second PFET 766 and NFET 767 have a driving force weaker than that of the first PFET 764 and NFET 765.

Figure 14:
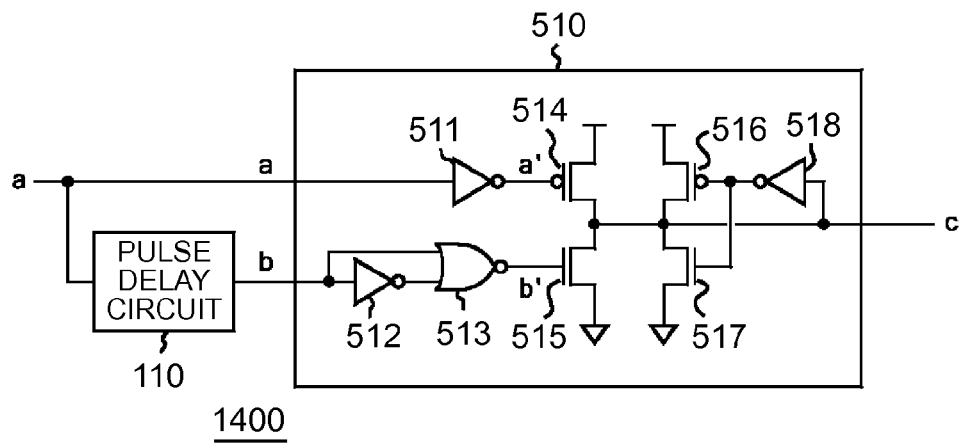
FIG. 14 is a circuit diagram illustrating one example of a pulse stretching circuit.

FIG. 14 illustrates one exemplary pulse stretching circuit 1400. In the pulse stretching circuit 1400, a pulse adjustment circuit 510 has the following configuration. That is, an input pulse signal a is input into a first inverter 511, and a delay pulse signal b is input into a second inverter 512. A 2-input NOR circuit 513 is connected to the second inverter 512, and the delay pulse signal b and an output pulse signal of the second inverter 512 are input therein. A first PFET 514 includes a gate connected to an output (an output signal a') of the first inverter 511. A first NFET 515 is connected in series with the first PFET 514, and includes a gate connected to an output (an output signal b') of the 2-input NOR circuit 513. A second PFET 516 is connected in parallel with the first PFET 514. A second NFET 517 is connected in parallel with the first NFET 515 and connected in series with the second PFET 516. A third inverter 518 includes an input connected to an output of the first PFET 514 and NFET 515 connected in series with each other and to an output of the second PFET 516 and NFET 517 connected in series with each other, and includes an output connected to both gates of the second PFET 516 and NFET 517. The output of the first PFET 514 and NFET 515 connected in series with each other and the output of the second PFET 516 and NFET 517 connected in series with each other serve as an output of the pulse adjustment circuit 510. The second PFET 516 and NFET 517 have a driving force weaker than that of the first PFET 514 and NFET 515.

Figure 15:
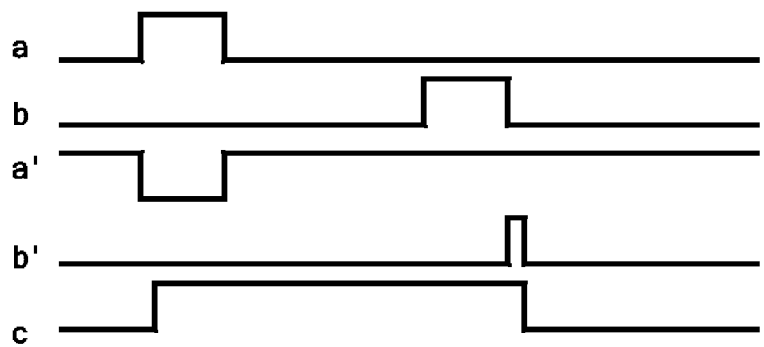
FIG. 15 is a waveform diagram of a circuit illustrated in FIG. 14.

FIG. 15 illustrates a waveform diagram of each of pulse signals a, b, and c of the pulse stretching circuit 1400 and output signals a' and b' of the first inverter 511 and the 2-input NOR circuit 513. As illustrated in this waveform diagram, a leading edge of the output pulse signal c is caused in response to a leading edge of the input pulse signal a. A state (a projected state in FIG. 10) in which the output pulse signal c is displaced with the leading edge thus caused is kept longer than a total time of times for both pulse widths of the input pulse signal a and the delay pulse signal b. This state is latched in a flip-flop section constituted by the first PFET 514 and NFET 515, the second PFET 516 and NFET 517, and the third inverter 518 by the output signal a' of the first inverter 511 generated from the input pulse signal a, and is released from the flip-flop section by the output signal b' of the 2-input NOR circuit 513 generated from the delay pulse signal b. Also, a trailing edge of the output pulse signal c is caused in response to a trailing edge of the output signal b' of the 2-input NOR circuit 513 generated in response to a trailing edge of the delay pulse signal b.

The present invention has been explained as above using embodiments, but the technical scope of the present invention is not limited to the scope described about the embodiments. Various changes or improvements can be added to the embodiments, and aspects to which such changes or improvements are added naturally fall within the technical scope of the present invention.

The invention claimed is:

1. A pulse stretching circuit, comprising:
A pulse stretching circuit, comprising:
a pulse delay circuit having a pulse delay circuit input for receiving an input pulse signal and a pulse delay circuit output for outputting a delay pulse signal; and
a pulse adjustment circuit connected to the pulse delay circuit, the pulse adjustment circuit receiving the input pulse signal and the delay pulse signal and outputting an output pulse signal having a pulse width longer than a pulse width of the input pulse signal, wherein the pulse adjustment circuit causes a leading edge of the output pulse signal in response to a leading edge of the input pulse signal, and a trailing edge of the output pulse signal in response to a trailing edge of the delay pulse signal, the input pulse signal having a first pulse width and the delay pulse signal having a second pulse width, the first and the second pulse width including a completely non-overlapping relationship with respect to each other, and wherein the pulse adjustment circuit includes:
a latch circuit having a set input and a reset input, the set input receiving the input pulse signal and the reset input receiving the delay pulse signal, wherein the delay pulse signal is a delayed version of the input pulse signal, the latch circuit including a latch circuit output for generating a latch circuit output signal based on the received input pulse signal and the received reset input, and
an OR circuit having a first, a second, and a third OR circuit input, the first OR circuit input connected directly to the input pulse signal, the second OR circuit input connected directly to the pulse delay circuit output, and the third OR circuit input connected directly to the latch circuit output, wherein the first and the second input of the OR circuit receive the input pulse signal and the delay pulse signal that is the delayed version of the input pulse signal.

2. The pulse stretching circuit according to claim 1, wherein the OR circuit includes:
   a 3-input NOR circuit for receiving the input pulse signal, the delay pulse signal, and the the latch circuit output signal; and
   an inverter connected to the 3-input NOR circuit.

3. The pulse stretching circuit according to claim 2, wherein the latch circuit includes a first 2-input NOR circuit and a second 2-input NOR circuit,
   the first 2-input NOR circuit receives the input pulse signal and an output pulse signal of the second 2-input NOR circuit, and
   the second 2-input NOR circuit receives the delay pulse signal and an output pulse signal of the first 2-input NOR circuit and outputs the output pulse signal of the latch circuit.

4. The pulse stretching circuit according to claim 1, wherein the latch circuit includes a first 2-input NOR circuit and a second 2-input NOR circuit,
   the first 2-input NOR circuit receives the input pulse signal and an output pulse signal of the second 2-input NOR circuit, and
   the second 2-input NOR circuit receives the delay pulse signal and an output pulse signal of the first 2-input NOR circuit and outputs the latch circuit output signal.

5. A pulse stretching method, comprising:
   generating a delay pulse signal from an input pulse signal;
   generating an output pulse signal having a pulse width longer than a pulse width of the input pulse signal, from the input pulse signal and the delay pulse signal thus generated, wherein a leading edge of the output pulse signal is caused in response to a leading edge of the input pulse signal, and a trailing edge of the output pulse signal is caused in response to a trailing edge of the delay pulse signal, the input pulse signal having a first pulse width and the delay pulse signal having a second pulse width, the first and the second pulse width including a completely non-overlapping relationship with respect to each other;
   receiving, at a set input of a latch circuit, the input pulse signal;
   receiving, at a reset input of the latch circuit, the delay pulse signal that is a delayed version of the input pulse signal;
   generating, by the latch circuit, a latch circuit output signal based on the received input pulse signal and the received delay pulse signal, the latch circuit output signal including a rising edge and a falling edge, the rising edge of the latch circuit output signal occurring on a rising edge of the received input pulse signal, and the falling edge of the latch circuit output signal occurring on a rising edge of the received delay pulse signal; and
   generating a logical sum from the generated latch circuit output signal, the received input pulse signal, and the received delay pulse signal.

\* \* \* \* \*